United States Patent [19]

Blanchard et al.

[11] Patent Number: 4,738,683

[45] Date of Patent: Apr. 19, 1988

[54] METHOD OF FABRICATION OF GATES FOR INTEGRATED CIRCUITS

[75] Inventors: Pierre Blanchard, Echirolles; Jean P. Cortot, Grenoble, both of France

[73] Assignee: Thomson-CSF, Paris, France

[21] Appl. No.: 792,975

[22] Filed: Oct. 30, 1985

[30] Foreign Application Priority Data

Nov. 6, 1984 [FR] France ................... 84 16871

[51] Int. Cl.⁴ .................. H01L 21/32; H01L 21/82; H01L 29/78
[52] U.S. Cl. .......................... 437/53; 29/571; 29/578; 29/591; 148/DIG. 50; 148/DIG. 51; 148/DIG. 111; 437/193; 437/241
[58] Field of Search ............... 156/653, 657; 29/571, 29/578, 591

[56] References Cited

U.S. PATENT DOCUMENTS

| | | | |
|---|---|---|---|
| 4,063,992 | 12/1977 | Hosack | 29/571 |
| 4,083,098 | 4/1978 | Nicholas | 29/578 |
| 4,514,251 | 4/1985 | Van Ommen | 29/578 |
| 4,574,468 | 3/1986 | Slotboom | 29/578 |

FOREIGN PATENT DOCUMENTS

| | | |
|---|---|---|
| 0098652 | 1/1984 | European Pat. Off. . |
| 0132009 | 1/1985 | European Pat. Off. . |
| 2111304 | 6/1983 | United Kingdom . |

OTHER PUBLICATIONS

IEEE J. of Solid State Circuit, vol. SC-12, No. 4, Aug. 1977, pp. 363-367, Harold H. Hosack, Rudolph H. Dyck, "Submicron Patterning of Surfaces".
IEEE Trans. on Electron Devices, vol. ED-25, No. 1, Jan. 1978, pp. 68-69, H. H. Hosack, "Min. Geometry Etch Windows to a Polysilicon Surface".
IEEE Electron Device Letters, EDL-2, No. 4, Apr. 1981, pp. 92-94, Author-V. J. Kapoor, "Charge-Coupled Devices with Submicron Gaps".
IBM Journal of Research & Dev't., vol. 24, No. 3, May 1980, pp. 339-347, Author: V. L. Rideout, "A One-Device Memory Cell Using a Single Layer of Polysilicon and a Self-Registering Metal-to-Polysilicon Contact", p. 341, p 5, p. 342, col. 2.

Primary Examiner—Brian E. Hearn
Assistant Examiner—Chi-Tso Huang

[57] ABSTRACT

In order to fabricate gates for an integrated circuit formed on a semiconductor substrate of silicon covered with at least one layer of oxide, one layer of polycrystalline silicon and if necessary one layer of silicide, an initial step consists in successive deposition of a silicon nitride layer and a silicon oxide layer, openings in these two layers being then formed by photoetching in a second step. In a third step, the silicon oxide layer is partly removed by deoxidation in order to bare the nitride layer over a certain distance which determines the spacing between two consecutive gates, oxide being then grown within the openings formed during the second step. The final step consists in removing the nitride regions uncovered during the third step as well as the subjacent silicide layer if this latter is provided and the subjacent polycrystalline silicon layer.

4 Claims, 1 Drawing Sheet

FIG_1
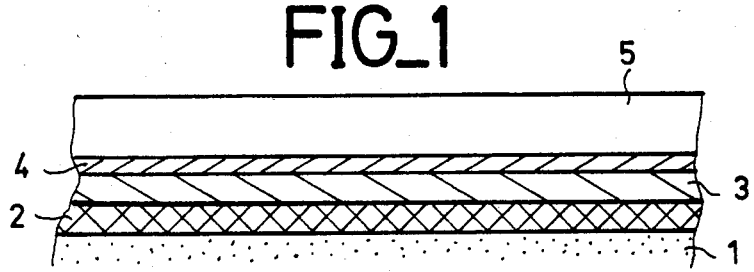
FIG_2
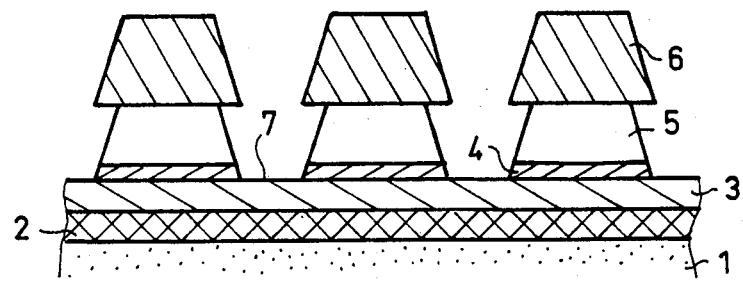
FIG_3
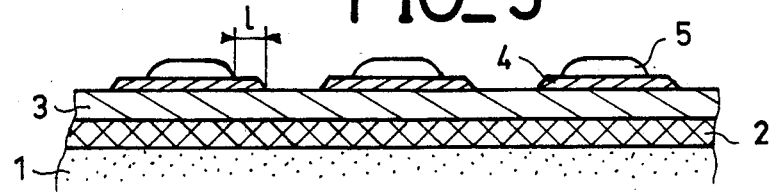
FIG_4
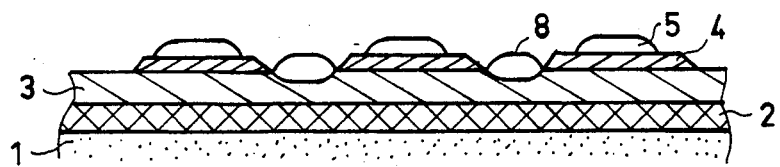
FIG_5
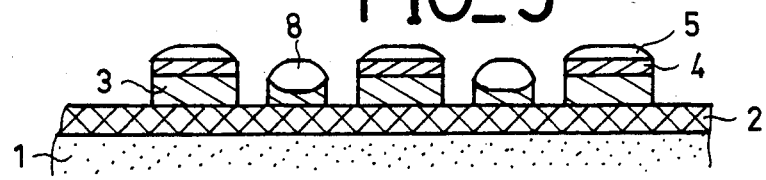

METHOD OF FABRICATION OF GATES FOR INTEGRATED CIRCUITS

BACKGROUND OF THE INVENTION

1. Field of the Invention

This invention relates to a method of fabrication of integrated circuit gates.

The method in accordance with the invention is employed in the case of integrated circuits which have an array of closely spaced gates such as charge-coupled devices, for example.

2. Description of the Prior Art

It is known to construct closely spaced gates by employing high-performance photolithographic machines. A spacing of the order of 2 μm between gates can thus be obtained.

The problem which arises is that of construction of gates having a spacing of less than 2 μm by making use of conventional means.

The present invention makes it possible to solve this problem and to obtain center-to-center gate spacings which can be reduced to as little as 0.2 μm.

SUMMARY OF THE INVENTION

In accordance with the invention, a method of fabrication of gates for an integrated circuit formed on a semiconductor substrate of silicon covered with at least one layer of oxide, one layer of polycrystalline silicon and if necessary one layer of silicide, comprises the following steps:

(1) a layer of silicon nitride and a layer of silicon oxide are deposited successively;
(2) openings are formed in these two layers by the photetching process;
(3) the silicon oxide layer is partly removed by deoxidation in order to bare the nitride layer over a certain distance which determines the spacing between two consecutive gates;
(4) the oxide is grown within the openings formed during the second step;
(5) the final step consists in removing the nitride regions uncovered during the third step as well as the subjacent layer of silicide if this latter is provided and the subjacent layer of polycrystalline silicon.

The advantages of the method in accordance with the invention include the following:
 simplicity of the method since it entails the need for only two additional layers for etching the gates, namely the nitride layer and the oxide layer;
 the fact that the spacing between gates is determined with precision, in particular because it does not depend on variations in thickness of the oxide layer which covers the nitride layer, as will be explained in the description given hereinafter;
 the fact that the method makes it possible to obtain gates of polycrystalline silicon as well as gates of polycrystalline silicon covered with silicide.

BRIEF DESCRIPTION OF THE DRAWINGS

Other features of the invention will be more apparent upon consideration of the following description and accompanying drawings, in which FIGS. 1 to 5 illustrate the different successive steps involved in the practical application of the method in accordance with the invention.

In the different figures, the same references designate the same elements but the dimensions and proportions of the various elements have not been observed for the sake of enhanced clarity.

DESCRIPTION OF THE PREFERRED EMBODIMENT

In FIG. 1, there is shown diagrammatically the semiconductor substrate 1 of silicon which is coated with at least one oxide layer 2 and one polycrystalline silicon layer 3.

The method in accordance with the invention can be employed both for the fabrication of gates of heavily doped polycrystalline silicon and for the fabrication of gates formed by a double layer of heavily doped polycrystalline silicon covered with a silicide. In this case, a polycrystalline silicon layer 3 is deposited on the oxide layer 2 and covered with a layer of a metal which produces a silicide, after annealing in a neutral atmosphere. By way of example, the metal employed can be tantalum.

The first step of the method in accordance with the invention as illustrated in FIG. 1 consists in depositing on the layer 3 a layer 4 of silicon nitride $Si_3N_4$ and then a layer 5 of silicon oxide $SiO_2$.

The oxide can be deposited in the vapor phase, for example, either at atmospheric pressure or at low pressure.

It is possible, for example, to employ a layer 3 of polycrystalline silicon having a thickness of 5000 Å, a silicon nitride layer 4 having a thickness of 500 Å and a silicon oxide layer 5 having a thickness of 1 μm.

A point worthy of note is that it is practically impossible to grow oxide on the nitride layer, thus entailing the need to deposit the oxide on the nitride.

Openings 7 are then formed in the two layers 4 and 5 by the photoetching technique, as shown in FIG. 2.

This operation defines the width of one gate out of two.

To this end, the known procedure consists in depositing on the oxide layer 5 a photosensitive resin 6 of the positive type, for example. The resin is then hardened by baking. A mask such as chromium on glass, for example, is then applied on the resin with a view to defining the windows to be etched. The resin is exposed to ultraviolet rays through the mask. The following step consists in making use of a suitable product for dissolving the exposed resin but allows the unexposed resin to remain. The oxide and the nitride are then etched in order to obtain the openings 7.

It is possible to perform chemical etching or dry plasma etching.

In order to ensure that the etching process is limited to the nitride and to the oxide and does not attack the polycrystalline silicon or the silicide, it is necessary to adjust the time of action of the product employed in the case of chemical etching and to choose a suitable selective gas in the event of adoption of the plasma etching process.

The following step consists first in stripping the resin previously used, then in partly removing the oxide layer by etching. Lateral removal of said oxide layer has the effect of baring the nitride layer over a certain distance. This step is illustrated in FIG. 3. The reference letter l designates the length of the nitride layer which is thus uncovered. This step is very important since it is this length l which will determine the spacing between two consecutive gates.

This partial etching step can be performed in such a manner as to obtain the desired gate spacing with a high degree of accuracy. This result is achieved by computing the length of time during which the product must be allowed to act in order to produce deoxidation as a function of the desired spacing.

Under well-defined conditions, 1000 Å of oxide are removed per minute. In order to achieve enhanced accuracy. etching can be slowed-down by diluting the etchant employed with water.

It is very important to note that the precsion obtained in regard to the dimension l, which is the length of the uncovered nitride layer, does not depend on the thickness of the oxide layer 5 but solely on the etching time.

Thus, even if the oxide layer 5 has a thickness which varies between 0.8 and 1 μm, the length of the uncovered nitride layer 4 remains the same since it is the lateral deoxidation which determines the length l whereas the thickness of the oxide layer does not come into consideration.

In the following step shown in FIG. 4, the oxide is grown within the openings 7 formed during the second step shown in FIG. 2.

Oxide layers 8 are thus obtained and localized at the openings 7 since the nitride does not readily oxidize.

The structure obtained consists successively of nitride 4, superposed deposits of nitride 4 and oxide 5, nitride 4, oxide 8, and so on.

The following step illustrated in FIG. 5 involves removal of the regions in which the nitride 4 is uncovered as well as the subjacent layer 3 of polycrystalline silicon or of polycrystalline silicon covered with silicide.

The removal operation just mentioned can be performed either by chemical etching or by plasma etching.

As can be seen in FIG. 5, gates relatively spaced at a distance l are thus obtained.

It is possible to remove the layers ofnitride 4 and oxide 5, and of oxide 8, which cover polysilicon gates 3 thus obtained.

After the step shown in FIG. 5, the limits of the integrated circuit which supports closely spaced gates can be fixed by photoetching the oxide layer 5. It is also possible, for example, to establish the limits of the integrated circuit after the step shown in FIG. 2.

By means of the method in accordance with the invention, it is possible to form gates having a well-defined relative spacing which can be reduced to approximately 0.2 μm. This spacing depends neither on the masking techniques employed nor on the thickness of the oxide layer employed but solely on the degree of accuracy of the deoxidation time-duration.

This method is of particular interest for the fabrication of charge-coupled devices (CCDs), whether such devices comprise one or a number of levels of gates.

What is claimed is:

1. A method of fabrication of gates for an integrated circuit formed on a semiconductor substrate of silicon covered with at least one contiguous layer of oxide, one layer of polycrystalline silicon and if necessary one layer of silicide, comprising the following steps:
   (1) successive deposition of a layer of silicon nitride and a layer of silicon oxide over the covered substrate;
   (2) formation of openings in said two last-mentioned layers by etching;
   (3) partial removal of the remainder of the silicon oxide layer by etching in order to uncover the nitride layer over a desired distance which determines the spacing betwen two consecutive gates;
   (4) growth of oxide selectively within the openings formed during the second step; and
   (5) removal of the nitride regions uncovered during the third step as well as any subjacent layer of silicide, and the subjacent layer of polycrystalline silicon to expose the contiguous layer of oxide.

2. A method in accordance with claim 1, wherein the silicon oxide layer is deposited in the vapor phase.

3. A method in accordance with claim 1, wherein the openings are formed either by the chemical etching process or by the dry plasma-etching process.

4. A method in accordance with claim 1, wherein removal of the uncovered nitride regions is carried out either by the chemical etching process or by the dry plasma-etching process.

* * * * *